US007727777B2

(12) United States Patent
Andideh et al.

(10) Patent No.: US 7,727,777 B2
(45) Date of Patent: Jun. 1, 2010

(54) FORMING FERROELECTRIC POLYMER MEMORIES

(76) Inventors: Ebrahim Andideh, 10141 NW. Priscilla Ct., Portland, OR (US) 97229; Mark Isenberger, 78 Dulce Ct., Corrales, NM (US) 87048; Michael Leeson, 111 NE. Graham St., Portland, OR (US) 97212; Mani Rahnama, 906 NW. Silverado Dr., Beaverton, OR (US) 97006

( * ) Notice: Subject to any disclaimer, the term of this patent is extended or adjusted under 35 U.S.C. 154(b) by 1415 days.

(21) Appl. No.: 10/160,641

(22) Filed: May 31, 2002

(65) Prior Publication Data

US 2003/0224535 A1 Dec. 4, 2003

(51) Int. Cl.
*H01L 21/00* (2006.01)

(52) U.S. Cl. .......................... 438/3; 438/240; 438/238; 438/250; 438/393; 257/E27.104

(58) Field of Classification Search .................... 438/3, 438/240, 238, 250–253, 393–399; 257/E27.104
See application file for complete search history.

(56) References Cited

U.S. PATENT DOCUMENTS

| | | | | |
|---|---|---|---|---|
| 4,939,568 | A * | 7/1990 | Kato et al. | 257/686 |
| 5,277,757 | A * | 1/1994 | Sato | 216/58 |
| 5,843,516 | A * | 12/1998 | Derbenwick et al. | 427/96 |
| 6,055,180 | A * | 4/2000 | Gudesen et al. | 365/175 |
| 6,232,212 | B1 * | 5/2001 | Degani et al. | 438/612 |
| 6,344,400 | B1 * | 2/2002 | Yutani | 438/396 |
| 6,420,190 | B1 * | 7/2002 | Shimoda et al. | 438/3 |
| 6,429,089 | B1 * | 8/2002 | Matsuki | 438/396 |
| 6,436,838 | B1 * | 8/2002 | Ying et al. | 438/710 |
| 6,541,869 | B1 * | 4/2003 | Gudesen et al. | |
| 6,593,058 | B1 * | 7/2003 | Feiring et al. | 430/270.1 |
| 6,798,003 | B2 * | 9/2004 | Li et al. | 257/295 |
| 2002/0008079 | A1 * | 1/2002 | Chung | 216/13 |
| 2002/0036934 | A1 * | 3/2002 | Hasegawa et al. | 365/200 |
| 2002/0044480 | A1 * | 4/2002 | Gudesen et al. | 365/145 |
| 2003/0017627 | A1 * | 1/2003 | Li et al. | 438/3 |
| 2003/0076649 | A1 * | 4/2003 | Speakman | 361/524 |
| 2003/0218896 | A1 * | 11/2003 | Pon et al. | 365/63 |

FOREIGN PATENT DOCUMENTS

| | | | |
|---|---|---|---|
| JP | 63-293729 | * | 11/1988 |
| JP | 63293729 | * | 11/1988 |
| JP | 10-22470 | * | 1/1998 |
| JP | 10-022470 | * | 1/1998 |
| JP | 10022470 | | 1/1998 |

OTHER PUBLICATIONS 1989-018689, an english abstract of Jp 63-293729, ferroelectric polymer memory by Derwent Information Ltd, 1989.*
JP410022470-A, an english abstract, 1998.*

* cited by examiner

*Primary Examiner*—H. Jey Tsai
(74) *Attorney, Agent, or Firm*—Trop, Pruner & Hu, P.C.

(57) ABSTRACT

In accordance with some embodiments, a ferroelectric polymer memory may be formed of a plurality of stacked layers. Each layer may be separated from the ensuing layer by a polyimide layer. The polyimide layer may provide reduced layer-to-layer coupling, and may improve planarization after the lower layer fabrication.

22 Claims, 3 Drawing Sheets

FORMING FERROELECTRIC POLYMER MEMORIES

BACKGROUND

This invention relates generally to ferroelectric polymer memories.

A ferroelectric polymer memory may be used to store data. Data may be stored in layers within the memory. The higher the number of layers, the higher is the capacity of the memory. Each of the polymer layers include polymer chains with dipole moments. Data may be stored by changing the polarization of the polymer between metal lines. No transistors are needed for storage.

As a result, ferroelectric polymer memories are non-volatile memories with relatively fast read and write speeds. For example, microsecond initial reads may be possible with write speeds comparable to those of flash memories.

Generally, in polymer memories, the same material is used for the interlayer dielectric between the various polymer layers and for passivation layers. This results in a relatively thick film to avoid ferroelectric coupling. Moreover, the presence of fluorine in these materials introduces outgasing and degrades reliability. Another approach is to use photoresist, but this material is not stable for long-term operation of devices and it is a reliability liability.

Thus, there is a need for better ways to separate the layers in multiple layer, stacked polymer memories.

DETAILED DESCRIPTION

Figure 1:
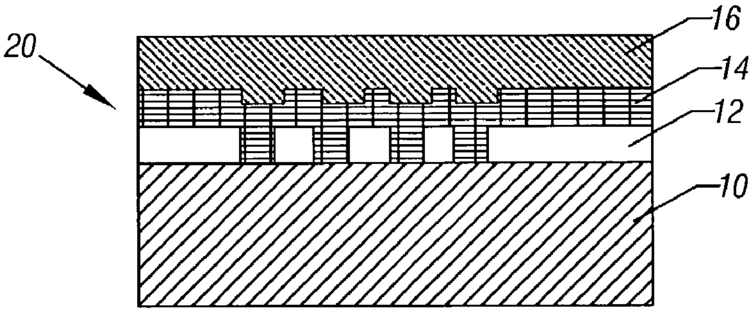
FIG. 1 is an enlarged cross-sectional view of one embodiment of the present invention.

Referring to FIG. 1, a first layer 20 of a multi-layer ferroelectric polymer memory includes a semiconductor substrate 10. A plurality of metal bitlines 12 run into the page. A polymer layer 14 may overlap the metal bitlines 12, extending over the bitlines 12 and down to the substrate 12 at locations between proximate metal bitlines 12. Finally, over the polymer layer 14 is a plurality of metal row lines 16 (only one of which is shown in FIG. 1) that extend transversely to the bitlines 12. Thus, the polarization of the polymer layer 14 may be changed using the overlying row lines 16 and the underlying bitlines 12 to store data in the polymer layer 14 at the intersections of row lines 16 and bitlines 12.

Figure 6:
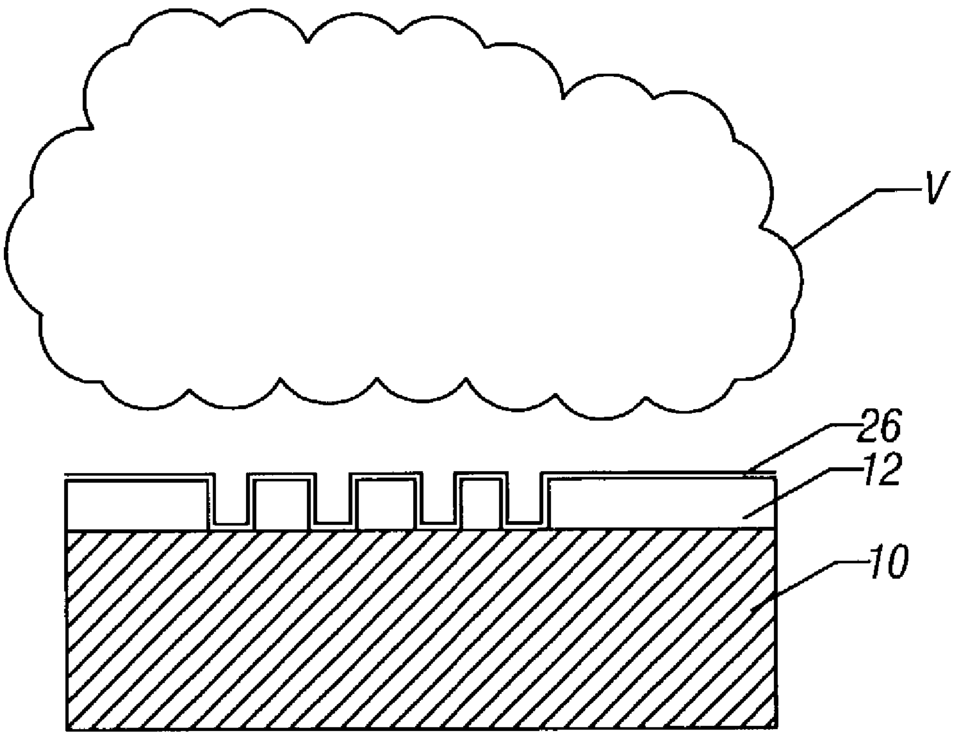
FIG. 6 is an enlarged cross-sectional view of another embodiment of the present invention.

The polymer layer 14 may be formed of a copolymer of vinyledene fluoride (VDF) and trifluoroethylene (TFE) in one embodiment of the present invention. Before coating the wafer with the layer 14, the wafer may be treated with hexamethyldisilazane (HMDS) in a vapor prime oven on a conventional photoresist spin track as indicated in FIG. 6. In one embodiment, the oven may be 100 degrees Celsius. Then the wafer may be spin coated with the VDF/TFE copolymer in diethylcarbonate (DEC) and heated to evaporate the DEC.

Figure 7:
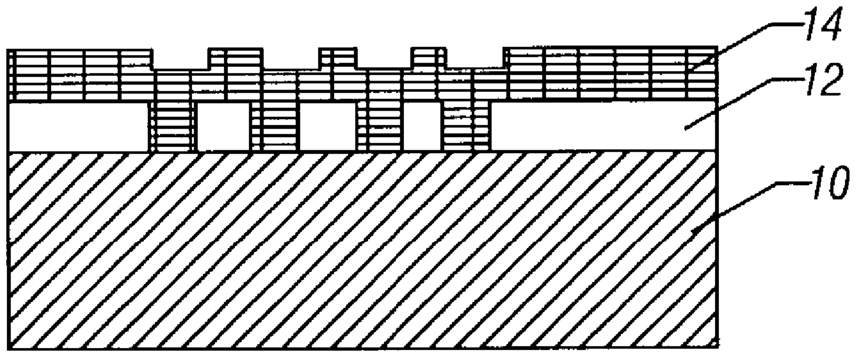
FIG. 7 is an enlarged cross-sectional view of the embodiment shown in FIG. 6 after additional processing.

The HMDS vapor, indicated at V in FIG. 6, may be dispensed with a nitrogen gas purge for sixty seconds in one embodiment, to form the coating 26. The wafer may be cooled to room temperature and then coated with the copolymer/DEC solution. The wafer may be annealed to form a piezoelectric film, in some embodiments, that acts as the polymer layer 14 as shown in FIG. 7. The HMDS treatment may provide a consistent, dry, contamination-free substrate on which to spin coat the VDF/TFE copolymer.

Figure 2:
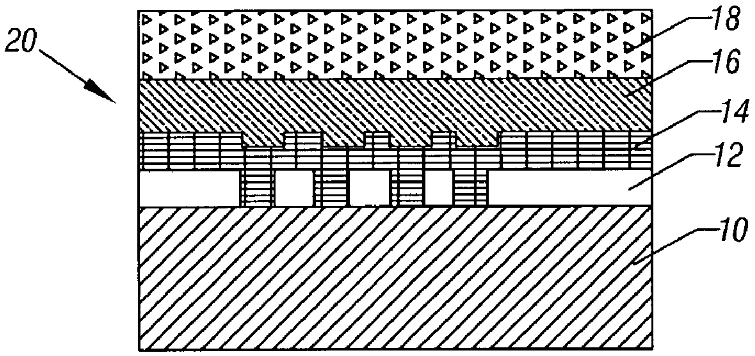
FIG. 2 is an enlarged cross-sectional view of the embodiment as shown in FIG. 1 after further processing in one embodiment of the present invention.

The layer 20 may be replicated a number of times to produce a stack of memory layers 20 that are capable of increasing the amount of data stored by the polymer memory. To this end, as shown in FIG. 2, a polyimide layer 18 may be formed over the metal row lines 16.

The polyimide layer 18 is a very low dielectric constant material that reduces the layer-to-layer coupling between different polymer memory layers 20. It also improves planarization after fabrication of a lower layer 20. The thickness of the polyimide layer 18 may be optimized for planarity and electrical isolation. Because polyimide can be formed at low temperatures, it may be integrated into the memory fabrication process without an excessive thermal burden.

Figure 3:
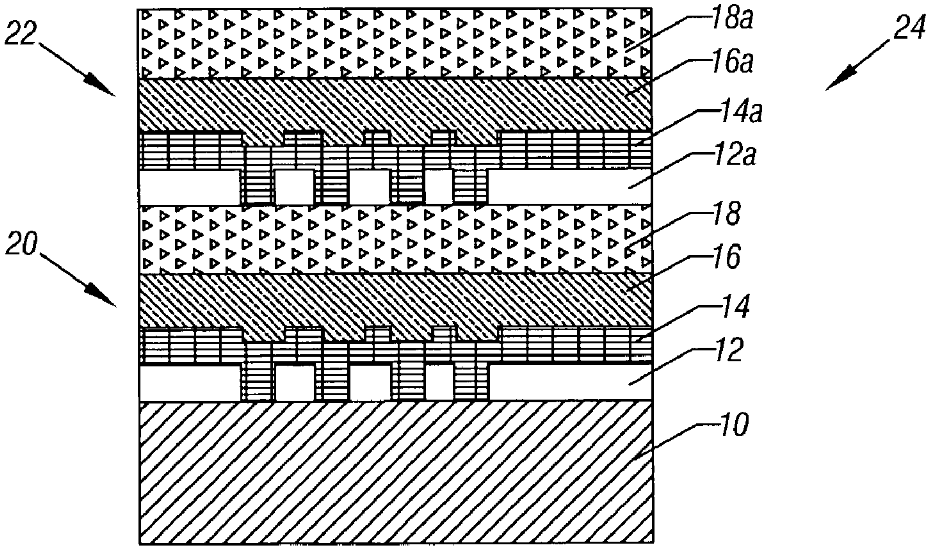
FIG. 3 is an enlarged cross-sectional view of the embodiment shown in FIG. 2 after further processing in one embodiment of the present invention.

Referring to FIG. 3, over the layer 20, a second layer 22 may be formed. The layer 22 may be formed on top of the polyimide layer 18 and may include metal bitlines 12*a*, a polymer layer 14*a*, and metal row lines 16*a*. A second polyimide layer 18*a* may be formed over the layer 22 to facilitate the stacking of still subsequent memory layers (not shown). If no subsequent layers are to be provided, the layer 18*a* acts as a passivation layer.

Figure 4:
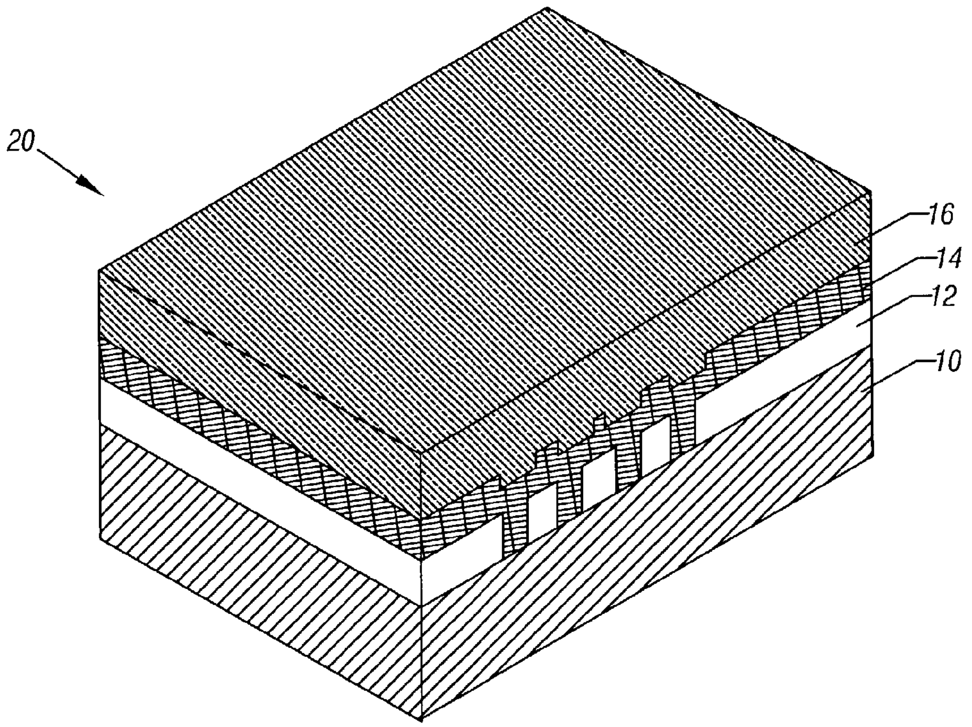
FIG. 4 is an enlarged perspective view of one embodiment of the present invention prior to patterning the row lines 16.

Referring to FIG. 4, a layer 16 may be deposited for subsequent patterning to form the row lines 16. In accordance with one embodiment of the present invention, a gas mixture may be utilized to etch metal on polymer with improved etch sensitivity and good uniformity. In one embodiment, helium may be included in an etching gas mixture made up of chlorine gas ($Cl_2$) and $BCL_3$.

Figure 5:
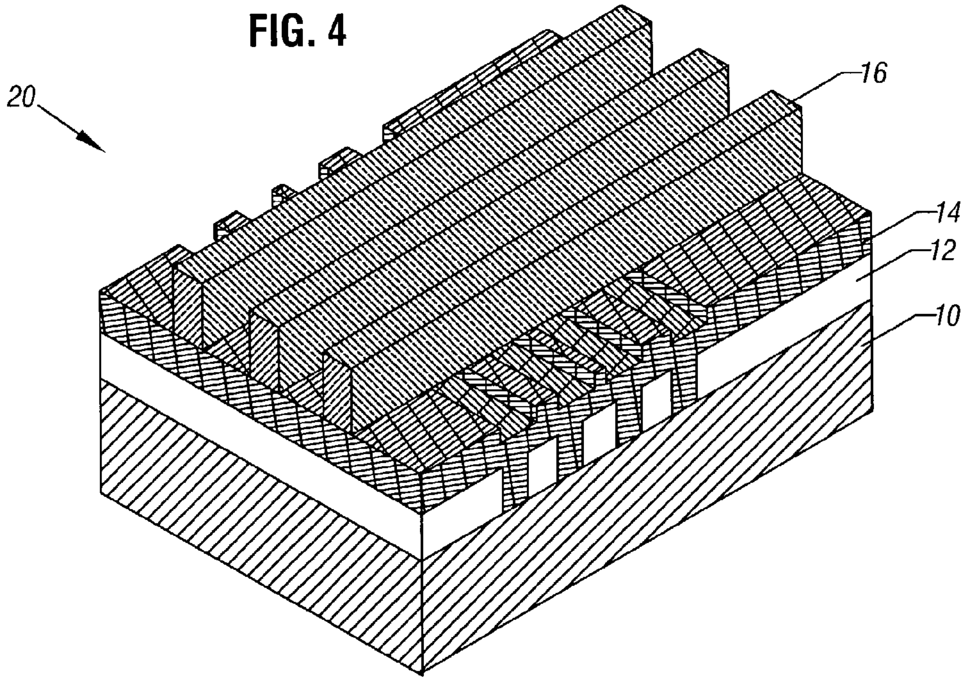
FIG. 5 is an enlarged perspective view after patterning the row lines in accordance with one embodiment of the present invention.

As a result of the etching, the structure shown in FIG. 5, with the defined row lines 16, is created with good sensitivity to the underlying polymer layer 14. In some embodiments, the metal to polymer etch selectivity is above 1:1.

Conventional metal patterning on polymer uses gas mixtures of $BCL_3$ and $Cl_2$ at high radio frequency bias power to produce an anisotropic metal profile. By lowering the radio frequency bias the extent of bombardment may be reduced. For example, radio frequency bias power may be less than 50 Watts and advantageously from about 20 to about 30 Watts in some embodiments. In addition, helium gas may be added to improve the metal etch uniformity and to reduce heavy bombardment on the wafer.

In some embodiments, a radio frequency plasma etcher having a magnetron current of 200 milliamps, and a radio frequency bias of 25 Watts. A $BCL_3$ gas flow rate at 35 standard cubic centimeters per minute (sccm), $Cl_2$ gas flow rate at 35 sccm, and helium flow rate at 100 sccm may be used. The aluminum etch rate is then 159.6 nm. per minute with a ferroelectric polymer etch rate of 57.2 nm. per minute resulting in a selectivity of 2.8. In general, selectivity greater than 1.25 is advantageous and selectivity greater than 2 may be particularly advantageous in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

coating a first metal layer with hexamethyldisilazane;

forming a copolymer layer including vinyledene fluoride and trifluoroethylene over said coating; and after forming said copolymer layer, annealing to form a piezoelectric film.

2. The method of claim 1 including forming said coating in a vapor prime oven.

3. The method of claim 2 including forming said layers on a wafer and rotating said wafer.

4. The method of claim 1 including spin coating the copolymer.

5. The method of claim 4 including spin coating the copolymer in an organic solvent solution.

6. The method of claim 5 including heating the wafer to evaporate the organic solvent.

7. The method of claim 1 including before forming said copolymer layer, cooling said first metal layer.

8. The method of claim 1 including forming a second metal layer over said copolymer to form a first layer of ferroelectric polymer memory.

9. The method of claim 8 including plasma etching said second metal layer using a gas mixture including helium.

10. The method of claim 8 including forming a polyimide layer over said second metal layer.

11. The method of claim 10 including forming a second layer of a ferroelectric polymer memory over said polyimide layer.

12. The method of claim 11 including forming another polyimide layer over said second layer of ferroelectric polymer memory.

13. A method comprising:

coating a first metal layer with hexamethyldisilazane;

forming a layer of polymer over said coating, said polymer to act as a ferroelectric polymer in a ferroelectric polymer memory; and plasma etching a second metal layer formed over said polymer at a radio frequency bias of less than 50 Watts and using a gas mixture including helium, said metal layers and polymer layer to form a first layer of ferroelectric polymer memory.

14. The method of claim 13 including forming a polyimide layer over said first layer of ferroelectric polymer memory.

15. The method of claim 14 including forming a second layer of a ferroelectric polymer memory and forming another polyimide layer over said second memory layer.

16. The method of claim 13 wherein forming a layer of polymer over said coating includes forming a copolymer layer including vinyledene fluoride and trifloroethylene over said coating.

17. The method of claim 16 including spin coating the copolymer in an organic solvent.

18. The method of claim 17 including evaporating the organic solvent using heat.

19. The method of claim 18 wherein plasma etching a second metal layer includes etching said metal layer with a selectivity greater then 1.25.

20. The method of claim 18 wherein plasma etching a second metal layer includes etching said metal layer with a selectivity greater than 2.

21. The method of claim 18 wherein plasma etching a second metal layer includes using a radio frequency bias from about 20 to about 30 Watts.

22. The method of claim 18 wherein plasma etching a second metal layer includes using a gas mixture including $Cl_2$ and $BCL_3$.

* * * * *